United States Patent [19]

Kawabuchi

[11] Patent Number: 4,514,233
[45] Date of Patent: Apr. 30, 1985

[54] METHOD OF MAKING IMPROVED ALUMINUM METALLIZATION IN SELF-ALIGNED POLYSILICON GATE TECHNOLOGY

[75] Inventor: Katsuhiro Kawabuchi, Kamakura, Japan

[73] Assignee: Tokyo Shibaura Denki Kabushiki Kaisha, Kawasaki, Japan

[21] Appl. No.: 523,835

[22] Filed: Aug. 17, 1983

[30] Foreign Application Priority Data

Aug. 25, 1982 [JP] Japan .................. 57-147055

[51] Int. Cl.³ .................. B01J 17/00; H01L 21/26
[52] U.S. Cl. .................. 148/1.5; 29/571; 29/576 B; 29/578; 148/175; 357/65; 357/67; 357/91
[58] Field of Search .................. 148/1.5, 175; 29/571, 29/576 B, 578; 357/65, 67, 91

[56] References Cited

U.S. PATENT DOCUMENTS

| | | | |
|---|---|---|---|
| 4,149,307 | 4/1979 | Henderson | 29/571 |
| 4,282,647 | 8/1981 | Richman | 29/571 |
| 4,343,082 | 8/1982 | Lepselter et al. | 29/576 B |
| 4,375,717 | 3/1983 | Tonnel | 29/571 |
| 4,400,867 | 8/1983 | Fraser | 29/571 |
| 4,413,403 | 11/1983 | Arizumi | 29/571 |

OTHER PUBLICATIONS

A. K. Sinha, Thin Solid Films, 90 (1982) 271.
Technical Digest of International Electron Devices Meeting: P. A. Gargini et al., 54, 1981.
Technical Digest of International Electron Devices Meeting: T. Shibata et al., 647, 1981.

Primary Examiner—Upendra Roy
Attorney, Agent, or Firm—Oblon, Fisher, Spivak, McClelland & Maier

[57] ABSTRACT

A method for manufacturing a semiconductor device, comprises the steps of sequentially forming a gate insulation film, a gate electrode film of polycrystalline silicon and a self-alignment film of silicon nitride on a semiconductor substrate having one conductivity type, patterning the gate electrode film and the self-alignment film in an identical electrode pattern, ion-implanting an impurity of an opposite conductivity type into the substrate using the silicon nitride pattern as a mask, thereby forming source and drain regions, forming an insulation layer on the entire surface of the substrate including the silicon nitride pattern, performing annealing, removing the remaining insulation layer which is located on the silicon nitride pattern, removing the silicon nitride pattern so as to expose the gate electrode pattern, and forming a metal film on the exposed gate electrode pattern.

11 Claims, 16 Drawing Figures

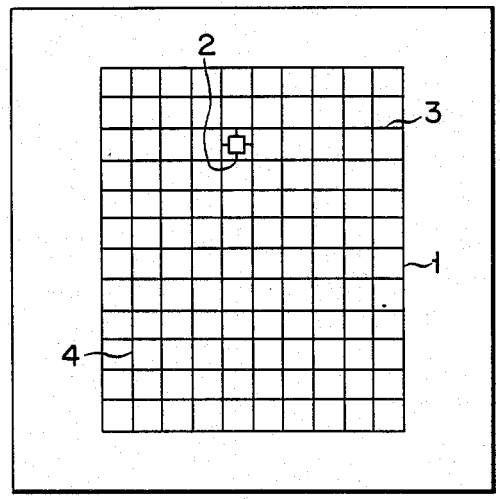
F I G. 1
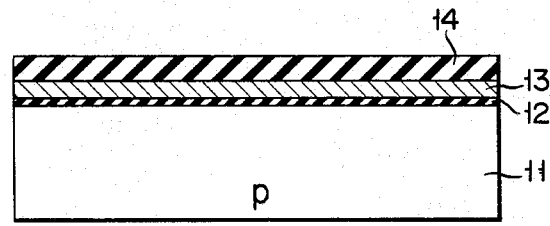
F I G. 2(a)
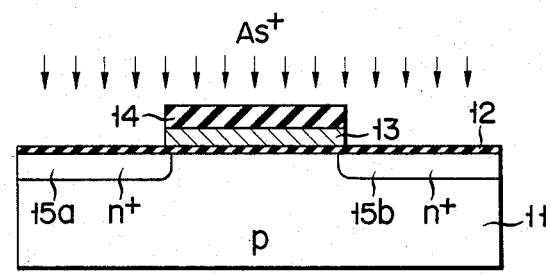
F I G. 2(b)

F I G. 2(c)
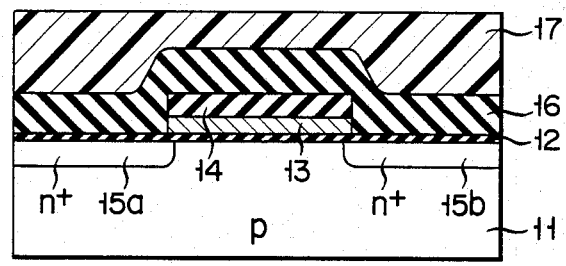
F I G. 2(d)
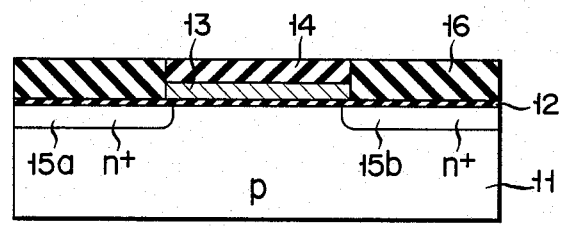
F I G. 2(e)
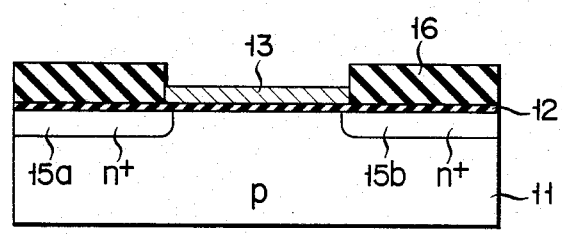
F I G. 2(f)
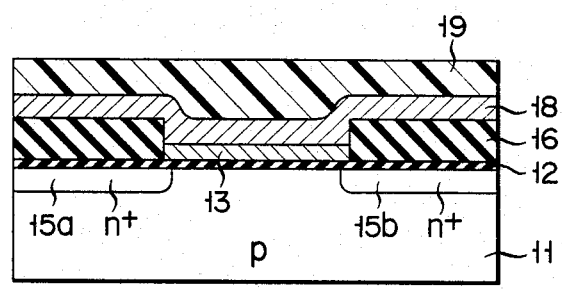

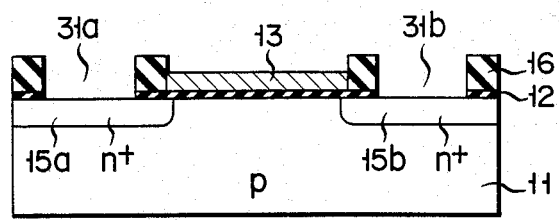
F I G. 3(a)
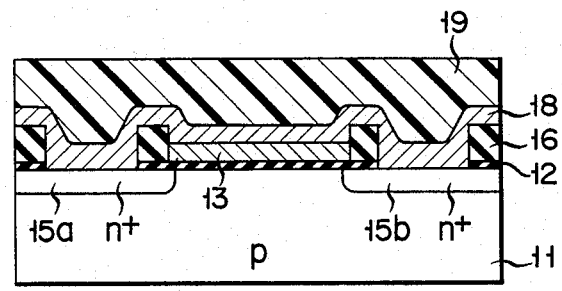
F I G. 3(b)
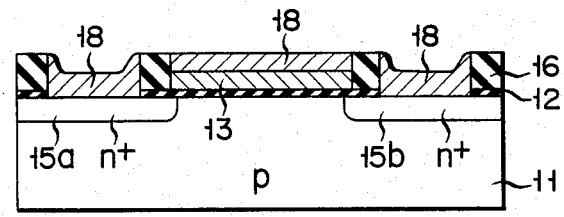
F I G. 3(c)
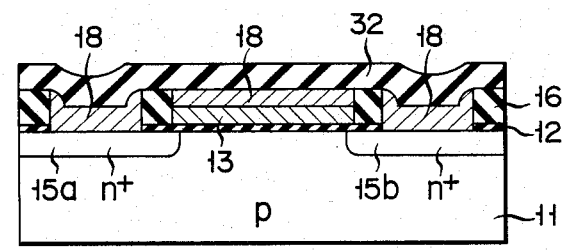
F I G. 3(d)
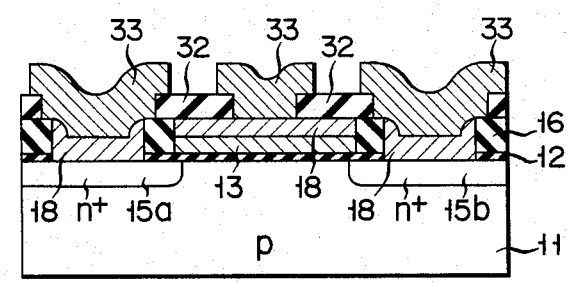
F I G. 3(e)

METHOD OF MAKING IMPROVED ALUMINUM METALLIZATION IN SELF-ALIGNED POLYSILICON GATE TECHNOLOGY

BACKGROUND OF THE INVENTION

1. Field of the Invention

The present invention relates to a method for manufacturing a semiconductor device and, more particularly, to a method for manufacturing an integrated circuit including a MIS field-effect transistor.

2. Description of the Prior Art

In the manufacture of integrated circuits, word lines for transmitting address data to memory cells are often made of the same material as that of a gate electrode of a MISFET. For example, as shown in FIG. 1, a cell array 1 of an integrated circuit basically consists of cells 2, word lines 3 and bit lines 4. The word lines 3 are connected to a gate electrode of each transistor called a transfer transistor. In an integrated circuit having a semiconductor silicon substrate, polycrystalline silicon is used for the gate electrode. Accordingly, the word lines 3 are often also made of polycrystalline silicon. Furthermore, diffusion layers for sources or drains which have the opposite conductivity type compared to the semiconductor substrate may also serve as the bit lines 4, or as power supply lines or ground lines.

A short response time is of prime importance in integrated circuits. However, delay (RC delay) in data transmission due to wiring resistance has prevented such a short response time. That is, the polycrystalline silicon constituting the word lines is electrically a semiconductor and therefore has a relatively high resistance. Such a high resistance of polycrystalline silicon results in a delay in data transmission through the word lines and hence a delay in signal transmission of an integrated circuit. When diffusion layers for sources or drains are used as bit lines, power supply lines or ground lines, a similar problem is encountered, since the diffusion layers are also electrically semiconductors.

In view of this problem, one proposal is to use an aluminum gate electrode. However, since aluminum has a melting point which is as low as 660° C., it cannot withstand annealing for formation of diffusion layers. Accordingly, this proposal is impractical.

SUMMARY OF THE INVENTION

It is an object of the present invention to provide a method for manufacturing a semiconductor device, which lowers the resistance of a gate electrode, so that the response time of the device is improved and the packing density of the device is also improved.

In order to achieve the above object, there is provided according to the present invention a method for manufacturing a semiconductor device, comprising the steps of:

sequentially forming a gate insulation film, a gate electrode film and a self-alignment film on a semiconductor substrate having one conductivity type;

patterning said gate electrode film and said self-alignment film in an identical electrode pattern;

doping an impurity of an opposite conductivity type into said substrate using a pattern of said self-alignment film as a mask, thereby forming an impurity region;

forming an insulation layer on an entire surface of said substrate including said pattern of said self-alignment film;

removing a portion of said insulation layer which is located on said pattern of said self-alignment film;

removing said pattern of said self-alignment film so as to expose said pattern of said gate electrode film; and forming a metal film on said pattern of said gate electrode film which is exposed.

In the method of the present invention, after the step of exposing the gate electrode pattern, the remaining insulation layer may be selectively removed to form an opening exposing the impurity region and metal film may be formed on the exposed gate electrode pattern and the impurity region.

After the insulation layer is formed, annealing may be performed to activate the impurity in the impurity region.

According to the present invention, after a gate electrode film of polycrystalline silicon or the like is formed, an impurity of an opposite conductivity type is doped into a substrate and annealing is performed, a low-resistance metal film of aluminum or the like is formed on the gate electrode film. Therefore, the resistance of the gate electrode can be sufficiently decreased, and thermal melting of the metal film can be prevented. For this reason, a response time of an integrated circuit having a word line of the same material as that of the gate electrode can be significantly improved. During the formation of the metal film, a thick insulation layer, thicker than the gate electrode film, remains at the side of the gate electrode film. Thus, the metal film can be formed on the gate electrode film in self-alignment therewith. This significantly improves the packing density of an integrated circuit. Since an opening exposing the impurity region is formed in the insulation layer, the metal film can be formed on the impurity region such as a source and drain. Accordingly, the response time of an integrated circuit using impurity regions formed in a semiconductor substrate as bit lines, electrode lines or ground lines can be significantly improved.

BRIEF DESCRIPTION OF THE DRAWINGS

FIG. 1 is a representation showing a cell array of a conventional integrated circuit;

FIGS. 3(a) to 3(e) are sectional views showing the steps of a method for manufacturing an integrated circuit according to another embodiment of the present invention.

DETAILED DESCRIPTION OF THE PREFERRED EMBODIMENTS

Figure 2G:
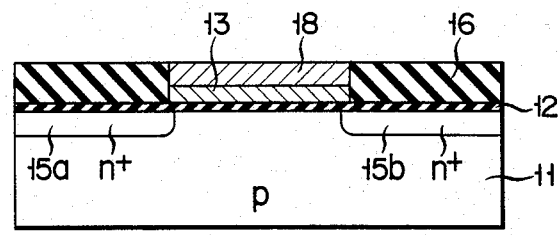
FIGS. 2(a) to 2(f) are sectional views showing the steps of a method for manufacturing an integrated circuit according to an embodiment of the present invention.

A method for manufacturing an integrated circuit according to an embodiment of the present invention will now be described with reference to FIGS. 2(a) to 2(f). Note that these figures illustrate only a part of the circuit including one transistor. First, as shown in FIG. 2(a), a gate insulation film 12 consisting of silicon dioxide is formed to a thickness of 400 Å by thermal oxidation of a p-type (100) silicon substrate 11 having a resistivity of 10 Ω-cm. A gate electrode film 13 of polycrystalline silicon of 2,000 Å thickness and a self-alignment film 14 of silicon nitride of 5,000 Å thickness are formed over the gate insulation film 12 by chemical vapor deposition. Using exposure and dry etching techniques, the silicon nitride film 14 and the polycrystalline silicon film 13 are selectively etched into a gate electrode shape as shown in FIG. 2(b). Ion-implantation of arsenic into the substrate 11 is performed using the silicon nitride film 14 and the polycrystalline silicon film 13 as a mask, thereby forming source and drain regions 15a and 15b.

In the next step as shown in FIG. 2(c), an insulation layer 16 of silicon dioxide is formed to a thickness of 7,000 Å on the entire surface of the substrate by chemical vapor deposition. With the silicon dioxide layer 16 thus formed, annealing at 1,000° C. is performed to activate the source and drain regions 15a and 15b. A photoresist film 17 is spin coated to a thickness of 2 $\mu$m on the silicon dioxide layer 16 to give a level surface to the film 17. By the reactive ion etching technique, using a mixture gas of $CH_4$ and $H_2$ as a reaction gas, the photoresist film 17 and the silicon dioxide film 16 are entirely etched until the silicon nitride film 14 is exposed, as shown in FIG. 2(d). Subsequently, the silicon nitride film 14 is removed using phosphoric acid as shown in FIG. 2(e). Thus, the top surface of the polycrystalline silicon film 13 is exposed and the side surfaces thereof are surrounded by the thick silicon dioxide layer 16 which is thicker than the film 13.

An aluminum film 18 having a thickness of 5,000 Å is deposited by vapor deposition on the entire surface of the substrate as shown in FIG. 2(f). Then, a photoresist film 19 is spin coated to a thickness of 2 $\mu$m to give a level surface of the film 19. By the reactive ion etching technique using $CCl_4$ as a reaction gas, the photoresist film 19 and the aluminum film 18 are etched until the silicon dioxide layer 16 is exposed, as shown in FIG. 2(g). Thus, the aluminum film 18 remains only on the polycrystalline silicon film 13.

Figure 2H:
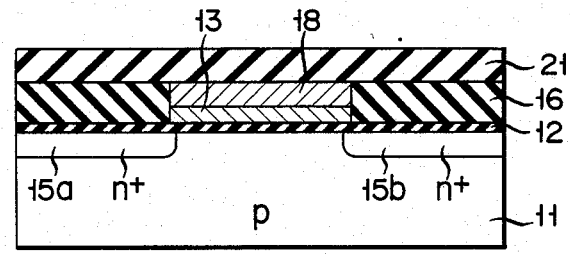
Figure 2I:
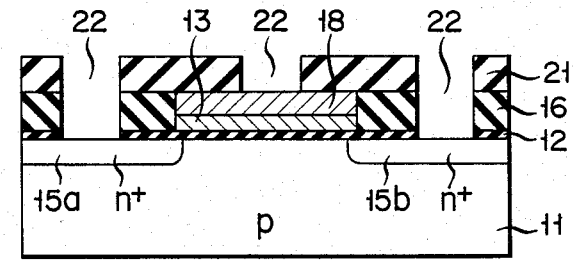

Then, as shown in FIG. 2(h), a silicon dioxide film 21 is formed by chemical vapor deposition (CVD) on the entire surface of the silicon substrate 11 including the silicon dioxide layer 16 and the aluminum film 18. Thereafter, as shown in FIG. 2(i), contact holes 22 are formed which respectively expose the source region 15a, the drain region 15b and the aluminum film 18.

Figure 2J:
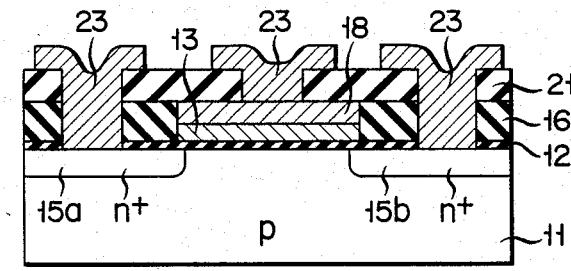

Finally, as shown in FIG. 2(j), a further aluminum layer is formed on the entire surface and is selectively etched to form an aluminum wiring pattern 23, thereby providing a desired MOS transistor.

According to the method of the present invention, a low-resistance aluminum film 18 can be formed on the polycrystalline silicon film 13 as a gate electrode in self-alignment therewith. As a result, the resistance of the gate electrode serving also as a word line can be significantly reduced, thereby improving the response time of the integrated circuit. According to experiments conducted by the present inventors, the resistance of the gate electrode can be lowered to 1/10 or less of the conventional value by formation of the aluminum film 18. Since no annealing for activation of the impurity doped in the substrate is required after formation of the aluminum film 18, the aluminum film 18 will not melt during subsequent steps.

FIGS. 3(a) to 3(e) are sectional views showing steps of a method for manufacturing an integrated circuit according to another embodiment of the present invention. The same reference numerals as used in FIGS. 2(a) to 2(j) denote the same parts referred to in FIGS. 3(a) to 3(e), and a detailed description thereof will be omitted. The second embodiment differs from the first embodiment in that a metal film is formed on the source and drain regions 15a and 15b and is connected thereto. Thus, the manufacturing steps up to FIG. 2(e) remain the same in this embodiment. However, using the exposure and dry etching techniques, the silicon dioxide film 16 and the gate insulation film 12 are selectively removed to form openings 31a and 31b, as shown in FIG. 3(a). Then, as in the first embodiment, the aluminum film 18 and the photoresist film 19 are formed as shown in FIG. 3(b). By the reactive ion etching technique, the aluminum film 18 and the photoresist film 19 are etched until the silicon dioxide layer 16 is exposed. As a result, as shown in FIG. 3(c), the aluminum film 18 is selectively left on the polycrystalline silicon film 13, the source region 15a and the drain region 15b. Thereafter, a silicon dioxide film 32 is formed by the plasma growth technique as shown in FIG. 3(d). Contact holes are formed and an aluminum wiring pattern 33 is formed as shown in FIG. 3(e) to complete a MOS transistor.

According to this second embodiment, the aluminum film 18 can be formed on the polycrystalline silicon film 13 as a gate electrode film in self-alignment therewith. At the same time, the aluminum film 18 can also be formed on the source and drain regions 15a and 15b in self-alignment therewith.

Accordingly, the second embodiment has the same effect as that of the first embodiment. In addition, in an integrated circuit wherein the impurity regions 15a and 15b are used as bit lines, power supply lines, or ground lines, the aluminum film 18 is in contact with these regions 15a and 15b and is present thereabove. As a consequence, the resistances of these regions can be reduced, and the response time can be improved.

As shown in FIG. 3(e), the metal wiring layer formed on the source and drain regions 15a and 15b has a bilayered structure of the aluminum film 18 and an aluminum wiring pattern 33. Even if the contact holes are deep, disconnection will not occur and formation of the aluminum wiring pattern is easy.

The present invention is not limited to the particular embodiments described above. For example, the metal film is not limited to an aluminum film but may consist of any metal which has a high melting point but reacts at a high temperature, such as tungsten, tantalum, molybdenum or titanium. Furthermore, the self-alignment film may consist of any substance other than silicon nitride, e.g., silicon oxynitride, that has a high melting point and is nonreactive. Formation of source and drain regions is not limited to ion-implantation but may be extended to thermal diffusion.

The method for selectively etching the insulation layer on the self-alignment film may be a method which does not use a leveling film such as a photoresist film, but comprises a method for filling the troughs of the insulation layer with a film which has the same etching rate. Various other changes and modifications may be made within the spirit and scope of the present invention.

What is claimed is:

1. A method for manufacturing a semiconductor device, comprising the steps of:
    (a) sequentially forming a gate insulation film, a polycrystalline silicon film and a self-alignment film on a semiconductor substrate of one conductivity type;
    (b) selectively removing said polycrystalline silicon film and said self-alignment film to form a laminate structure having a pattern corresponding to a desired gate electrode pattern and comprising the remaining polycrystalline silicon film and the remaining self-alignment film formed thereon;

(c) ion-implanting an impurity of an opposite conductivity type into said substrate using said laminate structure as a mask, thereby forming at least one impurity region;
(d) forming an insulation layer on an entire surface of the structure obtained in step C including said laminate structure;
(e) etching said insulation layer in a direction of thickness thereof until the surface of said laminate structure, thereby allowing said insulation layer to remain only around said laminate structure, said remaining insulation layer having a surface flush with that of said laminate structure is exposed;
(f) removing said remaining self-alignment of film from said laminate structure so as to expose said remaining polycrystalline silicon film of said laminate structure;
(g) forming an aluminum film only on said exposed remaining polycrystalline silicon film, thereby providing a gate electrode structure comprising said remaining polycrystalline film and said aluminum film, said aluminum film having a surface flush with that of said remaining insulation layer; and
(h) performing annealing to activate said impurity ion-implanted into said substrate, before said aluminum film is formed.

2. A method according to claim 1, wherein said step of forming said aluminum film comprises substeps of forming a continuous aluminum layer over said remaining insulation layer and said exposed remaining polycrystalline silicon film, forming a photoresist film on said metal layer so as to provide a flat surface, and etching said photoresist film and said continuous aluminum layer in a direction of thickness thereof until the surface of said remaining insulation layer is exposed.

3. A method according to claim 1, wherein said gate electrode film comprises polycrystalline silicon.

4. A method according to claim 1, wherein said self-alignment film comprises silicon nitride.

5. A method according to claim 1, wherein said impurity region includes source and drain regions.

6. A method of manufacturing a semiconductor device, comprising the steps of:
(a) sequentially forming a gate insulation film, a polycrystalline silicon film and a self-alignment film on a semiconductor substrate of one conductivity type;
(b) selectively removing said polycrystalline silicon film and said self-alignment film to form a laminate structure having a pattern corresponding to a desired gate electrode pattern and comprising the remaining polycrystalline silicon film and the remaining self-alignment film formed thereon;
(c) ion-implanting an impurity of an opposite conductivity type into said substrate using said laminate structure as a mask, thereby forming at least one impurity region;
(d) forming an insulation layer on an entire surface of the structure obtained in step C including said laminate structure;
(e) etching said insulation layer in a direction of thickness thereof until the surface of said laminate structure, thereby allowing said insulation layer to remain only around said laminate structure, said remaining insulation layer having a surface flush with that of said laminate structure is exposed;
(f) removing said remaining self-alignment of film from said laminate structure so as to expose said remaining polycrystalline silicon film of said laminate structure;
(g) selectively removing a remaining part of said insulation layer so as to form an opening in said insulation layer which exposes said at least one impurity region therethrough;
(h) forming an aluminum film only on said exposed remaining polycrystalline silicon film and said exposed impurity region, thereby providing a gate electrode structure comprising said remaining polycrystalline film and said aluminum film formed on said remaining polycrystalline silicon film having a surface flushed with that of said remaining insulation layer; and
(i) performing annealing to activate said impurity ion-implanted into said substrate, before said aluminum film is formed.

7. A method according to claim 6, wherein said step of forming said aluminum film comprises substeps of forming a continuous aluminum layer over said remaining insulation layer, said impurity region and said exposed remaining polycrystalline silicon film, forming a photoresist film on said continuous aluminum layer so as to provide a flat surface, and etching said photoresist film and said continuous aluminum layer in a direction of thickness thereof until the surface of said remaining insulation layer is exposed.

8. A method according to claim 6, wherein said gate electrode film comprises polycrystalline silicon.

9. A method according to claim 6, wherein said self-alignment film comprises silicon nitride.

10. A method according to claim 6, wherein said impurity region includes source and drain regions.

11. A method of manufacturing a semiconductor device, comprising the steps of:
(a) sequentially forming a gate insulation film, a polycrystalline silicon film and a self-alignment film on a semiconductor substrate of one conductivity type;
(b) selectively removing said polycrystalline silicon film and said self-alignment film to form a laminate structure having a pattern corresponding to a desired gate electrode pattern and comprising the remaining polycrystalline silicon film and the remaining self-alignment film formed thereon;
(c) ion-implanting an impurity of an opposite conductivity type into said substrate using said laminate structure as a mask, thereby forming source and drain regions;
(d) forming an insulation layer on an entire surface of the structure obtained in step C, including said laminate structure;
(e) etching said insulation layer in a direction of thickness thereof until the surface of said laminate structure is exposed, thereby allowing said insulation layer to remain only around said laminate structure, said remaining insulation layer having a surface flush with that of said laminate structure;
(f) removing said remaining self-alignment film from said laminate structure so as to expose said remaining polycrystalline silicon film of said laminate structure;
(g) selectively removing said remaining insulation layer so as to form openings therein which expose said source and drain regions therethrough;
(h) forming aluminum films only on said exposed remaining polycrystalline silicon film, and only in said openings, thereby providing a gate electrode structure comprising said remaining polycrystalline film and said aluminum film formed thereon, said aluminum film having a surface flush with that of said remaining insulation layer;
(i) performing annealing to activate said impurity ion-implanted into said substrate, before said aluminum films are formed and
(j) forming a metal wiring pattern on said aluminum films.

* * * * *